(12) United States Patent
Hashimoto

(10) Patent No.: US 6,853,080 B2
(45) Date of Patent: Feb. 8, 2005

(54) ELECTRONIC DEVICE AND METHOD OF MANUFACTURING THE SAME, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 88 days.

(21) Appl. No.: 10/373,670

(22) Filed: Feb. 24, 2003

(65) Prior Publication Data

US 2003/0218190 A1 Nov. 27, 2003

(30) Foreign Application Priority Data

Mar. 6, 2002 (JP) ........................................ 2002-060889
Dec. 19, 2002 (JP) ........................................ 2002-367951

(51) Int. Cl.⁷ ............................................... H01L 23/48
(52) U.S. Cl. ...................... 257/758; 257/773; 257/776
(58) Field of Search .......................................... 257/758

(56) References Cited

U.S. PATENT DOCUMENTS 6,775,153 B2 * 8/2004 Hashimoto .................. 361/803

FOREIGN PATENT DOCUMENTS

| JP | 05-265022 | 10/1993 |
|----|-----------|---------|
| JP | 08-139126 | 5/1996 |
| JP | 10-253980 | 9/1998 |

* cited by examiner

*Primary Examiner*—David Nelms
*Assistant Examiner*—Thao P. Le
(74) *Attorney, Agent, or Firm*—Hogan & Hartson, LLP

(57) ABSTRACT

A plurality of lands are arranged in rows. The lands in adjacent rows are disposed in a staggered arrangement. A first interconnecting line is pulled out from each of the lands. Each of the lands is wider than the first interconnecting line in the row direction. A plurality of electrical connection sections are arranged in rows. The electrical connection sections in adjacent rows are disposed in a staggered arrangement. The lands are electrically connected with the electrical connection sections so as to overlap. Each of the electrical connection sections is a part of a second interconnecting line, and an insulating layer is formed between the second interconnecting lineing pattern other than the electrical connection sections and the first interconnecting lineing pattern.

9 Claims, 7 Drawing Sheets

ELECTRONIC DEVICE AND METHOD OF MANUFACTURING THE SAME, AND ELECTRONIC INSTRUMENT

Japanese Patent Application No. 2002-60889 filed on Mar. 6, 2002 and Japanese Patent Application No. 2002-367951 filed on Dec. 19, 2002, are hereby incorporated by reference in their entirety.

BACKGROUND OF THE INVENTION

The present invention relates to an electronic device and a method of manufacturing the same, and an electronic instrument.

An IC chip having a driver circuit is electrically connected with a liquid crystal panel by applying TAB (Tape Automated Bonding) or COF (Chip On Film) mounting. In conventional TAB or COF mounting, interconnecting lines formed on a substrate (tape or film) are bonded to interconnecting lines of the liquid crystal panel. A number of interconnecting lines are formed on the liquid crystal panel at a narrow pitch. Since the substrate easily expands or shrinks, misalignment of the joint sections between the interconnecting lines tends to occur. Therefore, it is difficult to secure electrical connection.

Misalignment of the joint sections between the interconnecting lines also occurs in the case where internal stress of the substrate occurring when manufacturing the substrate is released during the manufacturing steps. Therefore, it is also difficult to secure electrical connection.

BRIEF SUMMARY OF THE INVENTION

According to a first aspect of the present invention, there is provided an electronic device comprising:

a first substrate on which a first interconnecting lineing pattern having a plurality of lands is formed; and a second substrate on which a second interconnecting lineing pattern having a plurality of electrical connection sections is formed, wherein:

the lands are disposed in a plurality of rows, the lands in adjacent rows being disposed in a staggered arrangement;

a first interconnecting line is pulled out from each of the lands, each of the lands being wider than the first interconnecting line in a row direction;

the electrical connection sections are disposed in a plurality of rows, the electrical connection sections in adjacent rows being disposed in a staggered arrangement;

each of the lands is overlapped with one of the electrical connection sections for electrical connection; and each of the electrical connection sections is a part of a second interconnecting line, an insulating layer being formed between the second interconnecting lineing pattern other than the electrical connection sections and the first interconnecting lineing pattern.

An electronic instrument according to a second aspect of the present invention comprises the above electronic device.

A method of manufacturing an electronic device according to a third aspect of the present invention comprises:

electrically connecting a plurality of lands in a first interconnecting lineing pattern formed on a first substrate with a plurality of electrical connection sections in a second interconnecting lineing pattern formed on a second substrate so as to be overlapped with each other, wherein:

the lands are disposed in a plurality of rows, the lands in adjacent rows being disposed in a staggered arrangement;

a first interconnecting line is pulled out from each of the lands, each of the lands being wider than the first interconnecting line in a row direction;

the electrical connection sections are disposed in a plurality of rows, the electrical connection sections in adjacent rows being disposed in a staggered arrangement;

each of the electrical connection sections is a part of a second interconnecting line, an insulating layer being formed between the second interconnecting line other than the electrical connection sections and the first interconnecting lineing pattern.

DETAILED DESCRIPTION OF THE EMBODIMENT

Figure 1:
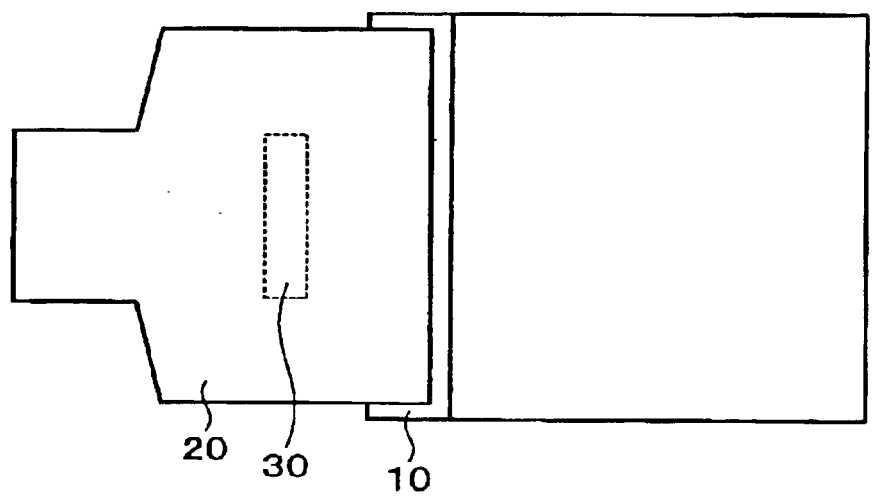
FIG. 1 is a view showing an electronic device according to a first embodiment of the present invention.

Embodiments of the present invention solve the above-described problems, and an objective of the embodiments of the present invention is to provide an electronic device in which electrical conductivity is reliably obtained and a method of manufacturing such an electronic device, and an electronic instrument.

(1) According to one embodiment of the present invention, there is provided an electronic device comprising:

a first substrate on which a first interconnecting lineing pattern having a plurality of lands is formed; and a second substrate on which a second interconnecting lineing pattern having a plurality of electrical connection sections is formed, wherein:

the lands are disposed in a plurality of rows, the lands in adjacent rows being disposed in a staggered arrangement;

a first interconnecting line is pulled out from each of the lands, each of the lands being wider than the first interconnecting line in a row direction;

the electrical connection sections are disposed in a plurality of rows, the electrical connection sections in adjacent rows being disposed in a staggered arrangement;

each of the lands is overlapped with one of the electrical connection sections for electrical connection; and each of the electrical connection sections is a part of a second interconnecting line, an insulating layer being formed between the second interconnecting lineing pattern other than the electrical connection sections and the first interconnecting lineing pattern. According to this embodiment, the lands are disposed in a staggered arrangement, so that an apparent connection pitch between the lands can be increased. Similarly, since the electrical connection sections are disposed in a staggered arrangement, an apparent connection pitch between the electrical connection sections can be increased. Moreover, since the lands are wider than the first interconnecting lines, an area of the lands to be overlapped with the electrical connection sections is increased. Therefore, the lands can be reliably and electrically connected with the electrical connection sections.

(2) In this electronic device, each of the electrical connection sections may be a projection of the second interconnecting line.

(3) In this electronic device, the lands in each row may be disposed along one side of the first substrate.

(4) In this electronic device, the electrical connection sections in each row may be disposed along one side of the second substrate.

(5) In this electronic device, the second substrate may have a rate of deformation due to at least one of heat and humidity larger than the deformation rate of the first substrate.

(6) In this electronic device, the first substrate may be a glass substrate.

(7) In this electronic device, the second substrate may be a flexible substrate.

(8) In this electronic device, the first substrate may be a part of an electro-optical panel.

(9) An electronic instrument according to one embodiment of the present invention comprises the above electronic device.

(10) According to one embodiment of the present invention, there is provided a method of manufacturing an electronic device comprising:

electrically connecting a plurality of lands in a first interconnecting lineing pattern formed on a first substrate with a plurality of electrical connection sections in a second interconnecting lineing pattern formed on a second substrate so as to be overlapped with each other, wherein:

the lands are disposed in a plurality of rows, the lands in adjacent rows being disposed in a staggered arrangement;

a first interconnecting line is pulled out from each of the lands, each of the lands being wider than the first interconnecting line in a row direction;

the electrical connection sections are disposed in a plurality of rows, the electrical connection sections in adjacent rows being disposed in a staggered arrangement;

each of the electrical connection sections is a part of a second interconnecting line, an insulating layer being formed between the second interconnecting line other than the electrical connection sections and the first interconnecting lineing pattern. According to this embodiment, the lands are disposed in a staggered arrangement, so that an apparent connection pitch between the lands can be increased. Similarly, since the electrical connection sections are disposed in a staggered arrangement, an apparent connection pitch between the electrical connection sections can be increased. Moreover, since the lands are wider than the first interconnecting lines, an area to be overlapped with the electrical connection sections is increased. Therefore, the lands can be reliably and electrically connected with the electrical connection sections.

(11) In this method of manufacturing an electronic device, the insulating layer may be formed on the second substrate avoiding the electrical connection sections, before electrically connecting the lands with the electrical connection sections so as to be overlapped with each other.

(12) In this method of manufacturing an electronic device, each of the electrical connection sections may be a projection in the second interconnecting line, and the projection may be formed by etching the second interconnecting line other than the electrical connection sections.

Other embodiments of the present invention will be described below with reference to the drawings.

First Embodiment

Figure 2:
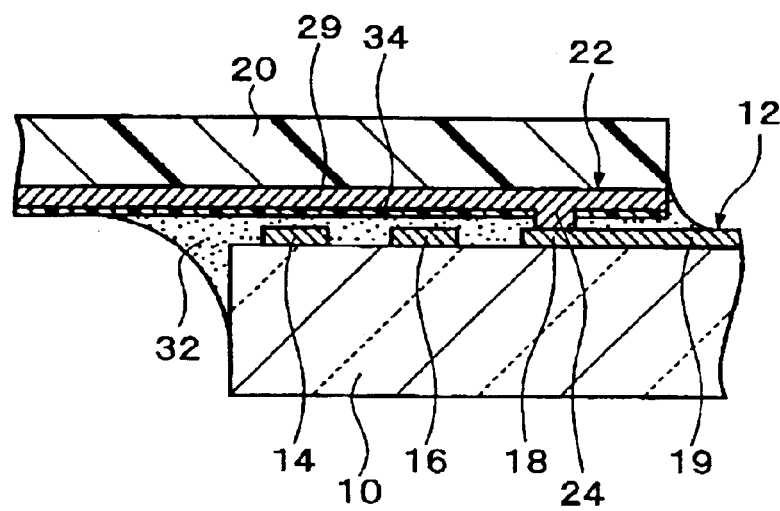
FIG. 2 is a partial enlarged sectional view of the electronic device according to the first embodiment of the present invention.
Figure 3:
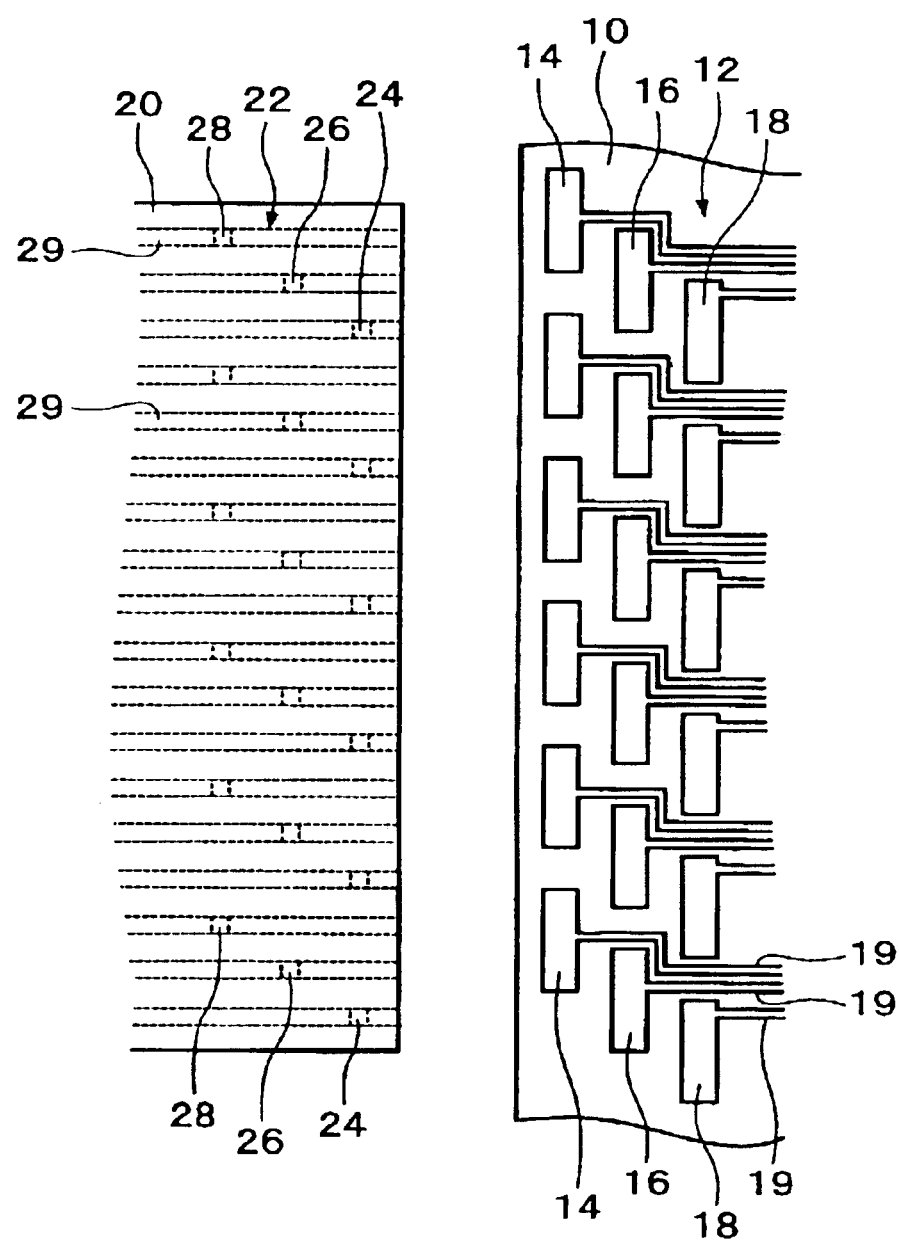
FIG. 3 is a partial enlarged and exploded view of the electronic device according to the first embodiment of the present invention.

FIG. 1 is a view showing an electronic device according to a first embodiment of the present invention. FIG. 2 is an enlarged cross-sectional view of apart of the electronic device. FIG. 3 is an enlarged exploded view of a part of the electronic device.

An electronic device has a first substrate 10. The first substrate 10 may be a glass substrate, for example. The first substrate 10 may be a part of an electro-optical panel (liquid crystal panel, electroluminescent panel, or the like). A first interconnecting lineing pattern 12 is formed on the first substrate 10. In the case of a liquid crystal panel, the first interconnecting lineing pattern 12 is electrically connected with electrodes which drive a liquid crystal (scanning electrodes, signal electrodes, common electrodes, and the like) The first interconnecting lineing pattern 12 may be formed of a metal film or a metal compound film such as ITO (Indium Tin Oxide), Cr, or Al or a composite film of these films.

The first interconnecting lineing pattern 12 has a plurality of lands 14, 16, and 18. The lands 14, 16, and 18 are arranged in a plurality of rows. For example, the lands 14 make up a first row, the lands 16 make up a second row, and the lands 18 make up a third row in that order from the edge of the first substrate 10. The lands in each row (lands 14 in the first row, for example) may be disposed along one side of the first substrate 10. This also applies to the lands 16 and 18 in the second and third rows. The lands in the adjacent rows (lands 14 and 16 in the first and second rows or lands 16 and 18 in the second and third rows, for example) are disposed in a staggered arrangement. The lands 14 and 18 in the first and third rows are also disposed in a staggered arrangement. Since the lands 14, 16, and 18 are disposed in a staggered arrangement, an apparent connection pitch can be increased.

First interconnecting lines 19 are pulled out from each of the lands 14, 16, and 18. Each of the lands 14, 16, and 18 is wider than the first interconnecting lines 19 in the row direction. The interval between adjacent lands in one row (lands 14 in the first row, for example) is smaller than the width (in the row direction) of the lands in another row (lands 16 or 18 in the second or third row, for example).

The electronic device has a second substrate 20. The second substrate 20 may be a flexible substrate or a film, for example. The second substrate 20 may be formed of a material having a rate of deformation due to at least one of heat and humidity (coefficient of thermal expansion, coefficient of humidity expansion, and the like) greater than that of the first substrate 10 (resin such as polyimide, for example). The second substrate 20 may allow internal stress occurring when manufacturing the substrate to be easily released during the manufacturing steps in comparison with the first substrate 10. This applies to the case where the second substrate 20 is a flexible substrate or a film and the first substrate 10 is a rigid substrate such as a glass substrate or a ceramic substrate, for example. The second substrate 20 may be thinner than the first substrate 10. A second interconnecting lineing pattern 22 is formed on the second substrate 20. The second substrate 20 on which the second interconnecting lineing pattern 22 is formed may be a wiring board.

The second interconnecting lineing pattern 22 has a plurality of electrical connection sections 24, 26, and 28. The electrical connection sections 24, 26, and 28 are arranged in a plurality of rows. For example, the electrical connection sections 24 make up a first row, the electrical connection sections 26 make up a second row, and the electrical connection sections 28 make up a third row in that order from the edge of the second substrate 20. The electrical connection sections in each row (electrical connection sections 24 in the first row, for example) may be disposed along one side of the second substrate 20. This also applies to the electrical connection sections 26 and 28 in the second and third rows. The electrical connection sections in the adjacent rows (electrical connection sections 24 and 26 in the first and second rows or electrical connection sections 26 and 28 in the second and third rows, for example) are disposed in a staggered arrangement. The electrical connection sections 24 and 28 in the first and third rows are also disposed in a staggered arrangement. Since the electrical connection sections 24, 26, and 28 are disposed in a staggered arrangement, an apparent connection pitch can be increased.

Each of the electrical connection sections 24, 26, and 28 is a part of a second interconnecting line 29. As shown in FIG. 2, each of the electrical connection sections 24, 26, and 28 may be a projection (or bump). In this case, each of the electrical connection sections 24, 26, and 28 projects from the second interconnecting lines 29 in the area other than the electrical connection sections 24, 26, and 28. As a modification example, each of the electrical connection sections 24, 26, and 28 may be substantially level with the second interconnecting lines 29 other than the electrical connection sections 24, 26, and 28.

As shown in FIG. 1, an integrated circuit chip (IC chip) 30 may be mounted on the second substrate 20. The integrated circuit chip 30 is a semiconductor chip. The integrated circuit chip 30 may be in the shape of a rectangular parallelepiped (rectangle on the plane). The integrated circuit chip 30 may be electrically connected with the second interconnecting lineing pattern 22. Electrodes in a first row (not shown) may be arranged along one of the two parallel sides (long sides of the rectangle on the plane, for example) of the integrated circuit chip 30, and electrodes in a second row (not shown) may be arranged along the other side. In this case, the integrated circuit chip 30 has a peripheral type of electrode arrangement. Each of the electrodes in the first row and the electrodes in the second row may include a pad formed of aluminum or the like, and a bump or the like formed of gold or the like on the pad, for example. A metal film such as an under-bump metal may be formed between the pad and the bump or the like. The integrated circuit chip 30 may include therein a driver (driver circuit for electro-optical panel (liquid crystal panel, electroluminescent panel, or the like), for example). In this case, the electrodes in the first row are input terminals of the driver, and the electrodes in the second row are output terminals of the driver.

External terminals (outer leads) (not shown) for electrically connecting with the outside (circuit board (motherboard) and the like (not shown)) may be formed on the edge of the second substrate 20 opposite to the edge on which the electrical connection sections 24, 26, and 28 are formed. Electronic parts (surface mounting parts, for example) (not shown) other than the integrated circuit chip 30 may be mounted on the second substrate 20.

As shown in FIG. 2, each of the lands (lands 18, for example) is electrically connected with one of the electrical connection sections (electrical connection sections 24, for example) so as to overlap. The land may be electrically connected with the electrical connection section by applying any conventional bonding method such as insulating resin bonding (bonding using NCP (Non Conductive Paste), NCF (Non Conductive Film), or the like, for example), anisotropic conductive material bonding (bonding using ACF (Anisotoropic Conductive Film) or the like, for example), alloy bonding (Au-Au or Au-Sn bonding, for example), and solder bonding. The first and second substrates 10 and 20 may be secured using an adhesive 32. The adhesive 32 may be NCP, NCF, or ACF. The adhesive 32 may cover the end face of the second interconnecting lineing pattern 22.

The first and second interconnecting lineing patterns 12 and 22 overlap in the area other than the lands 14, 16, and 18 and the electrical connection sections 24, 26, and 28. Therefore, an insulating layer 34 is formed between the second interconnecting lineing pattern 22 other than that of the electrical connection sections 24, 26, and 28 and the first interconnecting lineing pattern 12. The insulating layer 34 prevents electrical conduction between the first and second interconnecting lineing patterns 12 and 22 in the area other than the lands 14, 16, and 18 and the electrical connection sections 24, 26, and 28. The insulating layer 34 may be formed of a resin which is used as a resist.

The electronic device according to the present embodiment has the above-described configuration. A method of manufacturing the electronic device is described below. In the method of manufacturing the electronic device, the first and second interconnecting lineing patterns 12 and 22 are electrically connected by connecting the first and second substrates 10 and 20. In more detail, the first and second interconnecting lineing patterns 12 and 22 are electrically connected so that the lands 14, 16, and 18 overlap the electrical connection sections 24, 26, and 28. The insulating layer 34 may be formed on the second substrate 20 so as to avoid the electrical connection sections 24, 26, and 28 before electrically connecting the first and second interconnecting lineing patterns 12 and 22.

Figure 4A:
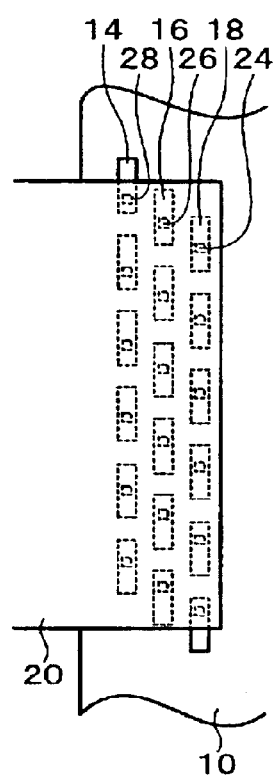
FIGS. 4A and 4B are views illustrating a method of manufacturing the electronic device according to the first embodiment of the present invention.
Figure 4B:
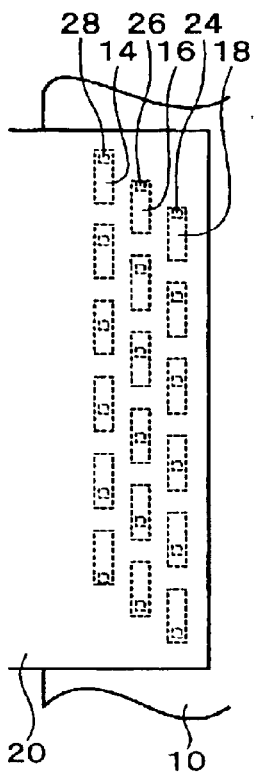

FIG. 4A is a view illustrating the method of manufacturing the electronic device according to the design. FIG. 4B is a view illustrating the method of manufacturing the electronic device in the actual situation. As is clear from FIGS. 4A and 4B, there may be a case where the size of the first and second substrates 10 and 20 is relatively changed in the actual manufacturing steps. In the example shown in FIG. 4B, the second substrate 20 expands or shrinks due to at least one of heat and humidity. There may be a case where internal stress is stored in the second substrate 20 when manufacturing the second substrate 20. The internal stress of the second substrate 20 may be released during the manufacturing steps, thereby causing the second substrate 20 to expand or shrink. As a result, the positional relation between the lands 14, 16, and 18 and the electrical connection sections 24, 26, and 28 differs from the design. However, in the present embodiment, since the lands 14, 16, and 18 are wider than the first interconnecting lines, the area in which the lands 14, 16, and 18 overlap the electrical connection sections 24, 26, and 28 is increased. Therefore, the lands 14, 16, and 18 can be electrically connected with the electrical connection sections 24, 26, and 28 reliably.

A device for performing COF mounting may be used in the electrical connection step. The lands may be electrically connected with the electrical connection sections by applying any conventional bonding method such as insulating resin bonding (bonding using NCP (Non Conductive Paste), NCF (Non Conductive Film), or the like, for example), anisotropic conductive material bonding (bonding using ACF (Anisotoropic Conductive Film) or the like, for example), alloy bonding (Au-Au or Au-Sn bonding, for example), and solder bonding.

The first and second substrates 10 and 20 may be connected by means of electrical connection between the lands 14, 16, and 18 and the electrical connection sections 24, 26, and 28. For example, NCP, NCF, or ACF may be used as the adhesive 32. The electronic device can be manufactured in this manner.

Second Embodiment

FIGS. 5A to 6C are views illustrating a method of manufacturing an electronic device according to a second embodiment to which the present invention is applied. In more detail, a method of forming an electrical connection section is described below.

In the present embodiment, a tape 40 is used. The tape 40 is a long film having insulating properties and flexibility. As a material for the tape 40, a polyimide resin, glass epoxy resin, BT resin, polyester resin, or the like is used. The second substrate is obtained by punching the tape 40.

Figure 5A:
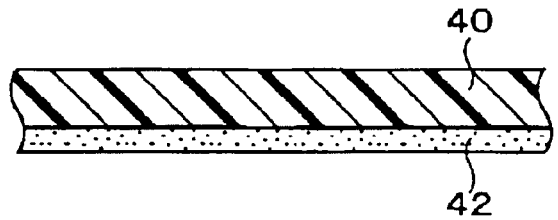
FIGS. 5A to 5D are views illustrating a method of manufacturing an electronic device according to a second embodiment of the present invention.
Figure 5B:
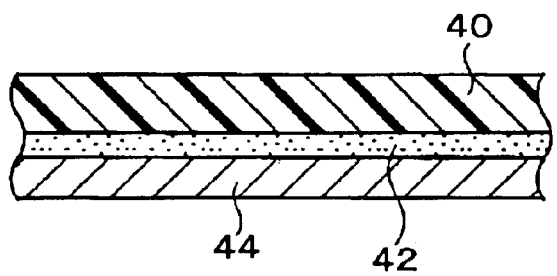
Figure 5C:
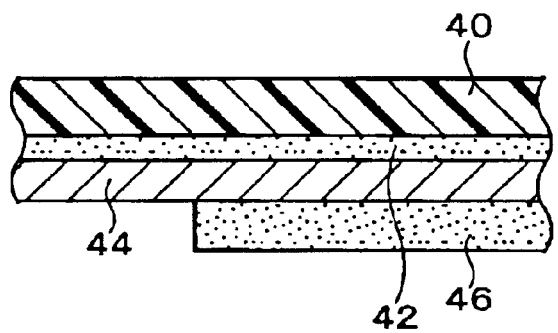

As shown in FIG. 5A, an adhesive 42 is applied to one side of the tape 40. As shown in FIG. 5B, a metal film (copper foil, for example) 44 is attached to the tape 40 through the adhesive 42. In the case where the tape 40 has adhesiveness, the metal film 44 may be attached to the tape 40 without applying the adhesive 42. As shown in FIG. 5C, a resist 46 is applied to the tape 40. The resist 46 is patterned in the shape of the second interconnecting lineing pattern. A material (resin, for example) for the resist 46 may be formed in the shape of the second interconnecting lineing pattern by using an ink-jet method.

Figure 5D:
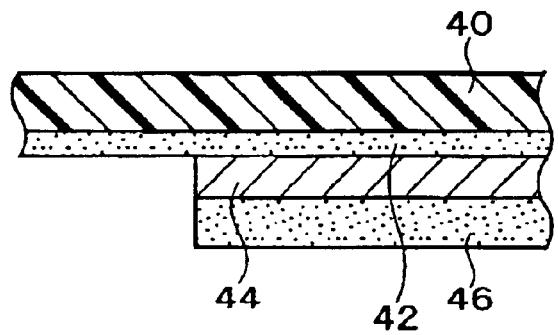

As shown in FIG. 5D, the metal film 44 is etched using the patterned resist 46 as a mask. The metal film 44 is thus patterned in the shape of the second interconnecting lineing pattern. The metal layer patterned in the shape of the second interconnecting lineing pattern may be formed by using an additive method instead of a subtraction (removal) method such as etching. For example, a thin metal film such as a copper film may be formed in the shape of the second interconnecting lineing pattern on the tape 40 by sputtering, and a thick metal layer may be formed on the thin metal film by electroplating.

Figure 6A:
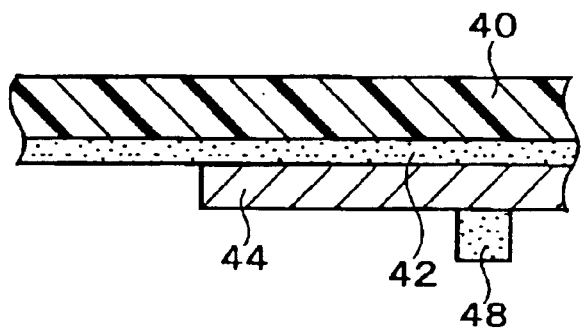
FIGS. 6A to 6C are views illustrating the method of manufacturing the electronic device according to the second embodiment of the present invention.
Figure 6B:
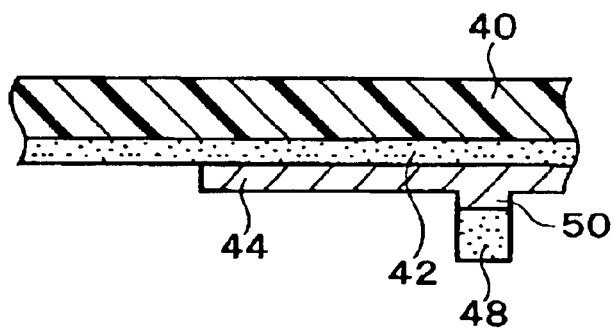
Figure 6C:
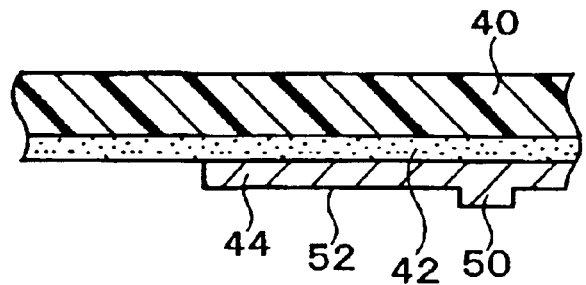

After removing the resist 46, a resist 48 is formed in an area in which a projection as the electrical connection section is formed, as shown in FIG. 6A. A material (resin, for example) for the resist 48 may be formed in the shape of the electrical connection section by using an ink-jet method. As shown in FIG. 6B, the metal film 44 is half-etched in the direction of the thickness. Since the thickness of the metal film 44 is decreased in the area which is not covered with the resist 48, the thickness of the area covered with the resist 48 is relatively increased, whereby a projection 50 is formed. The resist 48 is removed as shown in FIG. 6C, whereby an second interconnecting line 52 is formed.

The method of manufacturing the second interconnecting line 52 is not limited to the above-described method. For example, the second interconnecting line 52 maybe manufactured by forming a flat conductive pattern having a predetermined pattern shape on the tape 40, and forming the projection 50 on the conductive pattern. In this case, the flat conductive pattern may be formed by using a subtraction method or an additive method, for example. The projection 50 may be formed by applying conductive paste using an ink-jet method or a printing method (screen printing method). The projection 50 may be formed by forming a ball bump by means of wire bonding. The second interconnecting line 52 may be manufactured by combining some of the above-described methods. For example, the second interconnecting line 52 having the projection 50 may be formed by forming a conductive pattern having a projection by half-etching a flat conductive pattern formed in a predetermined pattern shape in a state in which a resist is formed on a part of the flat conductive pattern, and applying conductive paste to the projection or forming a ball bump. The second interconnecting line 52 having the projection 50 may be formed by forming a thick metal layer on a conductive pattern having a projection by electroplating. The projection 50 makes up apart of the second interconnecting line 52. The projection 50 may be used as the electrical connection section.

As shown in FIG. 2, the insulating layer 34 may be formed on the second interconnecting line 52 so that an area including at least a part of the projection 50 is exposed. The insulating layer 34 prevents occurrence of short circuits between the interconnecting lines. As the insulating layer 34, a resist or the like can be given.

Third Embodiment

Figure 7:
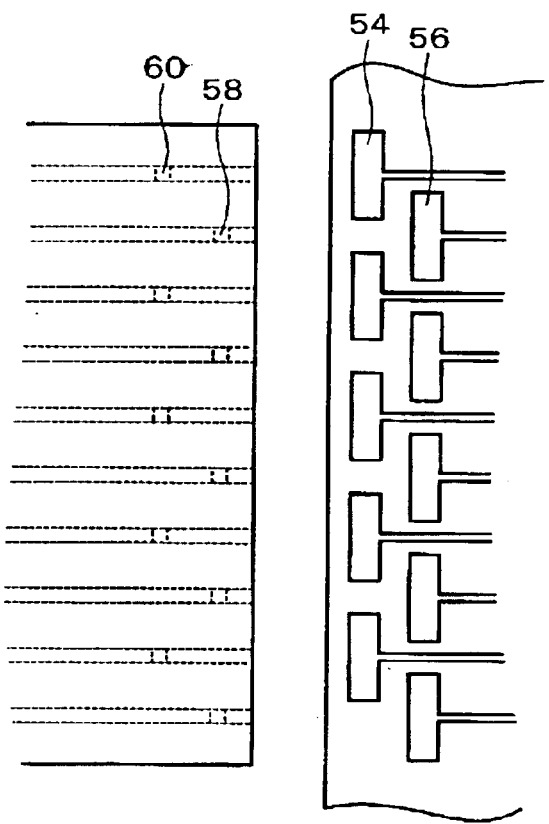
FIG. 7 is a partial enlarged and exploded view of an electronic device according to a third embodiment of the present invention.

FIG. 7 is an enlarged exploded view of a part of an electronic device according to a third embodiment to which the present invention is applied. In the present embodiment, a plurality of lands 54 and 56 and a plurality of electrical connection sections 58 and 60 are respectively formed in two rows. For example, the pitch of the lands 54 in one row may be substantially the same as the pitch of the lands 56 in the other row. The lands 54 and 56 are disposed in a staggered arrangement. For example, the lands 54 in one row are shifted at a half-pitch from the lands 56 in the other row. The pitch of the electrical connection sections 58 in one row may be substantially the same as the pitch of the electrical connection sections 60 in the other row. The electrical connection sections 58 and 60 are disposed in a staggered arrangement. For example, the electrical connection sections 58 in one row are shifted at a half-pitch from the electrical connection sections 60 in the other row. Other details in the present embodiment are the same as described in the first embodiment.

The first embodiment and the third embodiment illustrate the case where the staggered lands and electrical connection sections are disposed in three rows and two rows, respectively. However, the present invention may be applied to staggered lands and electrical connection sections disposed in four or more rows.

Figure 8:
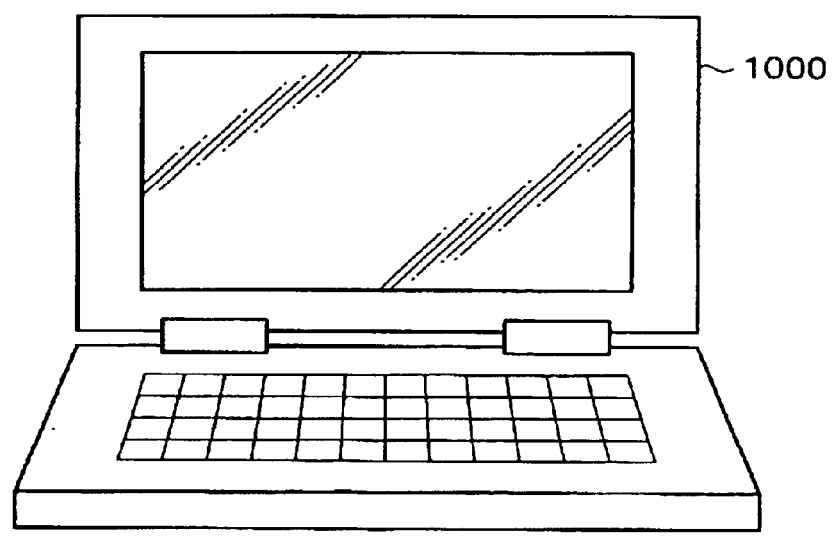
FIG. 8 is a view showing an electronic instrument according to one embodiment of the present invention.
Figure 9:
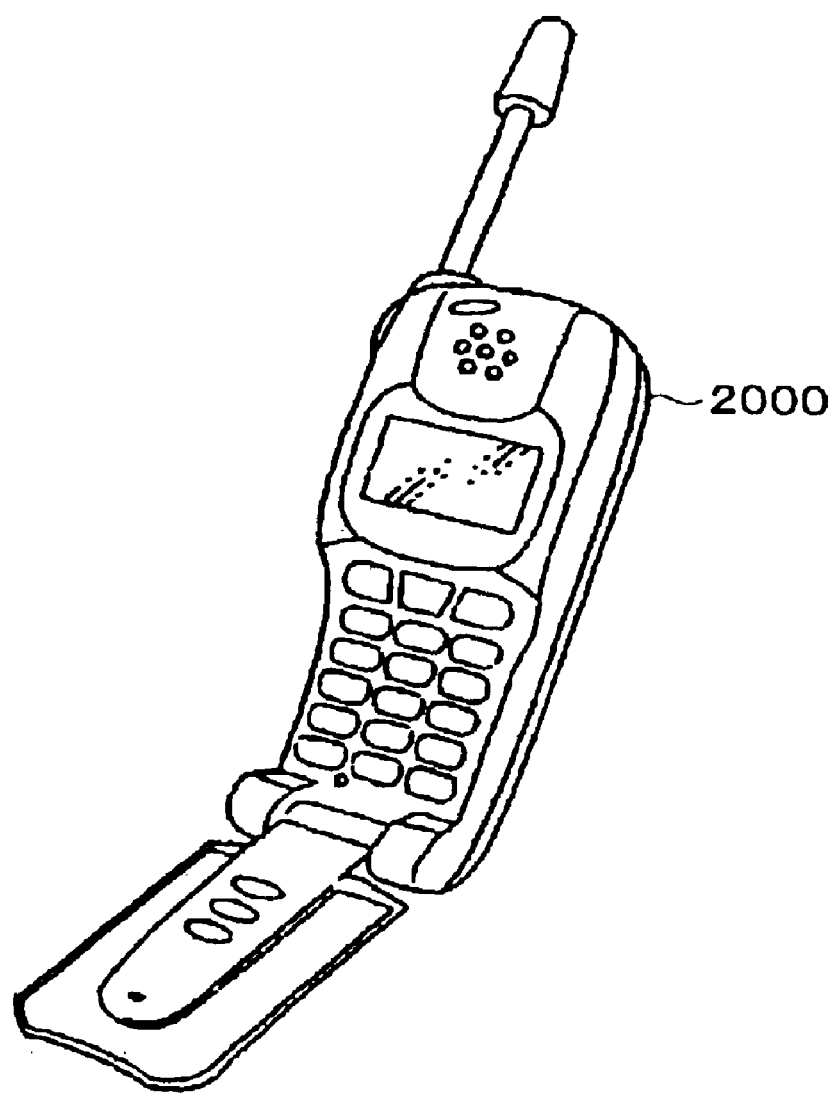
FIG. 9 is a view showing an electronic instrument according to one embodiment of the present invention.

FIGS. 8 and 9 respectively show a notebook-type personal computer 1000 and a portable telephone 2000 as examples of an electronic instrument including the above-described electronic device.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. An electronic device comprising:

a first substrate on which a first interconnecting lineing pattern having a plurality of lands is formed; and a second substrate on which a second interconnecting lineing pattern having a plurality of electrical connection sections is formed, wherein:

the lands are disposed in a plurality of rows, the lands in adjacent rows being disposed in a staggered arrangement;

a first interconnecting line is pulled out from each of the lands, each of the lands being wider than the first interconnecting line in a row direction;

the electrical connection sections are disposed in a plurality of rows, the electrical connection sections in adjacent rows being disposed in a staggered arrangement;

each of the lands is overlapped with one of the electrical connection sections for electrical connection; and each of the electrical connection sections is a part of a second interconnecting line, an insulating layer being formed between the second interconnecting lineing pattern other than the electrical connection sections and the first interconnecting lineing pattern.

2. The electronic device as defined in claim 1, wherein each of the electrical connection sections is a projection of the second interconnecting line.

3. The electronic device as defined in claim 1, wherein the lands in each row are disposed along one side of the first substrate.

4. The electronic device as defined in claim 1, wherein the electrical connection sections in each row are disposed along one side of the second substrate.

5. The electronic device as defined in claim 1, wherein the second substrate has a rate of deformation due to at least one of heat and humidity larger than the deformation rate of the first substrate.

6. The electronic device as defined in claim 5, wherein the first substrate is a glass substrate.

7. The electronic device as defined in claim 5, wherein the second substrate is a flexible substrate.

8. The electronic device as defined in claim 1, wherein the first substrate is a part of an electro-optical panel.

9. An electronic instrument comprising the electronic device as defined in claim 1.

* * * * *